United States Patent [19]
Conkle et al.

[11] Patent Number: 4,754,167
[45] Date of Patent: Jun. 28, 1988

[54] PROGRAMMABLE REFERENCE VOLTAGE GENERATOR FOR A READ ONLY MEMORY

[76] Inventors: Cecil Conkle, 717 Oregon Ave., Palo Alto, Calif. 94303; Qazi A. S. M. Mahmood, 3454 Woodside Ct., San Jose, Calif. 95121

[21] Appl. No.: 719,928

[22] Filed: Apr. 4, 1985

[51] Int. Cl.$^4$ .......................... H03K 3/01; G05F 3/16; G11C 17/00
[52] U.S. Cl. .................. 307/296 R; 365/104; 365/210; 365/226; 323/313
[58] Field of Search ............... 365/226, 227, 210, 203, 365/226, 204, 94, 103, 104; 307/296 R, 297; 323/311, 312, 313, 314, 315, 316, 317

[56] References Cited
U.S. PATENT DOCUMENTS
4,460,835 7/1984 Masuoka .................. 307/296 R
FOREIGN PATENT DOCUMENTS
0138091 8/1982 Japan ...................... 365/104

OTHER PUBLICATIONS
Denis et al, "Voltage Reference Circuit", IBM Technical Disclosure Bulletin, vol. 19, No. 10, Mar. 1977, p. 3760.

Primary Examiner—Stuart N. Hecker
Assistant Examiner—Glenn A. Gossage

[57] ABSTRACT

A read only memory (ROM) includes a series of bit lines biased by a reference voltage lead (102). The reference voltage lead (102) is connected to a first reference voltage generator (100) having an output impedance of 25 ohms and a second reference voltage generator (104) having an output impedance of 75,000 ohms. When the ROM is deselected, the first reference voltage generator (100) turns off and the bit lines are biased by the second reference voltage generator (100). However, when the ROM is selected, the first reference voltage generator (100) is turned on and biases the bit lines. In this way, a ROM is provided which can operate in a low power mode without decreasing the access time when the ROM goes from a deselected state into a selected state.

20 Claims, 2 Drawing Sheets

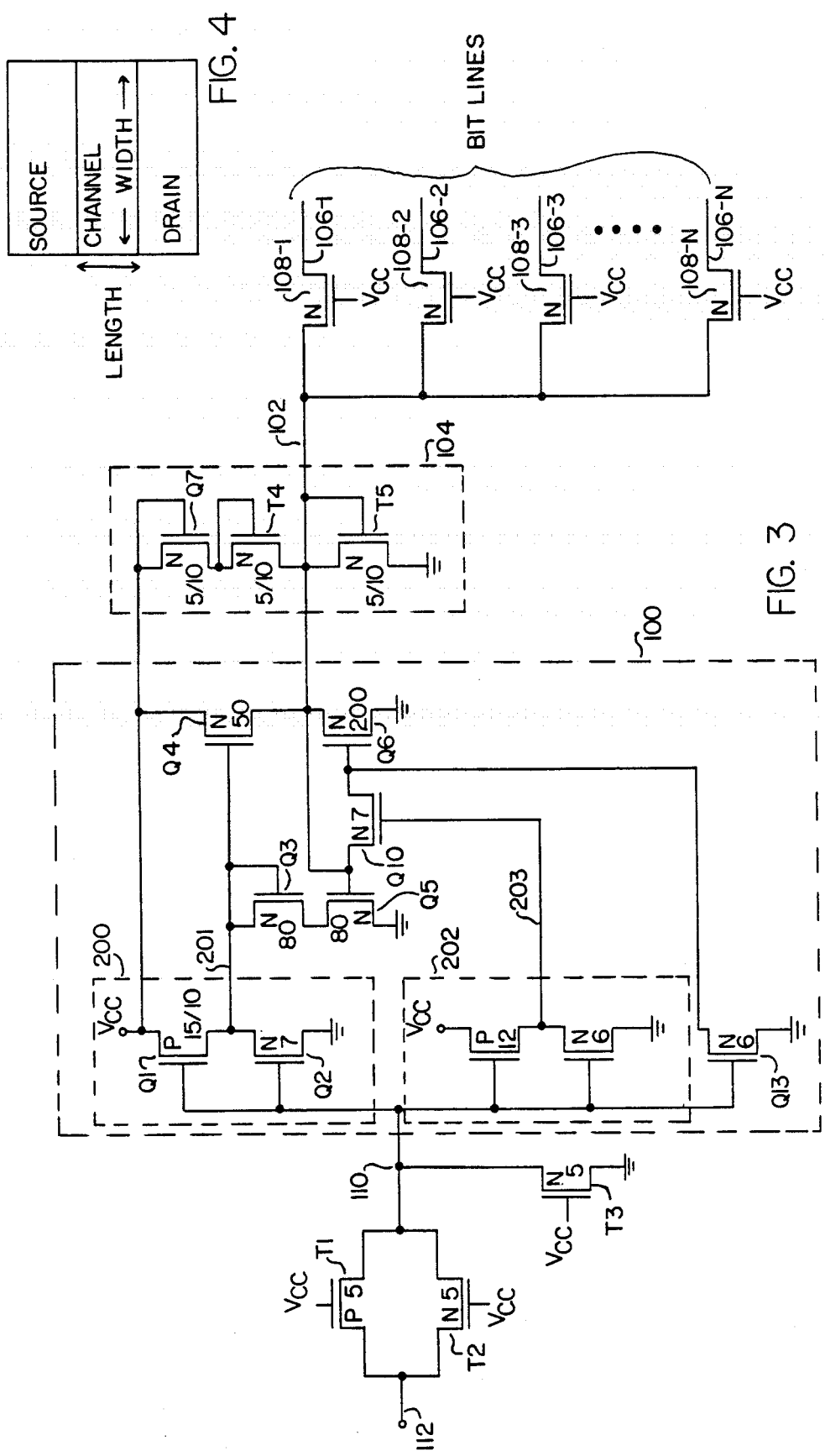

PROGRAMMABLE REFERENCE VOLTAGE GENERATOR FOR A READ ONLY MEMORY

BACKGROUND OF THE INVENTION

This invention relates to reference voltage generators and more specifically to reference voltage generators for use in MOS memories such as read only memories (ROMs), erasable programmable read only memories (EPROMs) and other MOS devices.

As is known in the art, a ROM is a device which stores information such that the information stored cannot be changed. Typical ROMs include a plurality of locations or addresses where information is stored and a plurality of address lines for selecting a location from which to retrieve the stored information. A partial schematic diagram of such a ROM illustrated in FIG. 1.

Referring to FIG. 1, a ROM constructed in accordance with the prior art includes an N channel or "NMOS" transistor 10 coupled between a bit line 12 and ground. (The letters next to the transistors in the drawings indicate whether they are P channel ("PMOS") or N channel ("NMOS") transistors.) NMOS transistor 10 includes a gate lead 14 coupled to a word line 16. During fabrication, NMOS transistor 10 is either rendered operative or inoperative (e.g. by doping the channel to raise the threshold voltage above 5 volts) depending upon whether it is desired to use transistor 10 to store a binary 1 or a binary 0. If rendered operative, during a read operation, the voltage on word line 16 is high (typically 5 volts) causing transistor 10 to turn on. However, if transistor 10 is inoperative, when the voltage on word line 16 is raised, transistor 10 does not turn on. The state of transistor 10 is sensed by a sense amplifier 28 which provides an output signal indicative of the state of transistor 10 as described below.

Bit line 12 is connected to VCC (typically 5 volts) via an NMOS transistor 18 and a resistor 20. Bit line 12 is also coupled to a reference voltage generator 22 via a reference voltage lead 23 and an NMOS transistor 24. The gate of NMOS transistor 24 is connected to VCC, and transistor 24 acts as a resistor. During operation, bit line 12 is charged to the reference voltage $V_{REF}$ present on lead 23. When it is desired to read the bit of data stored in transistor 10 (corresponding to whether transistor 10 is operative or inoperative), the voltage on word line 16 is raised to approximately 5 volts and the voltage on the gate lead of NMOS transistor 18 is raised to approximately 5 volts turning transistor 18 on. When that happens, if transistor 10 is inoperative, a voltage higher than the reference voltage $V_{REF}$ will be present at node 26. This voltage is presented to sense amplifier 28 which provides an output signal on an output lead 30 indicative of the fact that NMOS transistor 10 did not turn on. However, if NMOS transistor 10 is operative, raising the voltage at word line 16 causes NMOS transistor 10 to act as a closed switch, causing the voltage on bit line 12 to be pulled to ground. Since the gate of transistor 18 is at a high voltage, node 26 is also pulled to ground, and sense amplifier 28 provides an output voltage on lead 30 indicating that NMOS transistor 10 turned on.

It should be noted that it is not necessary to use a reference voltage generator such as reference voltage generator 22, but it is often desirable because of the resulting reduction in the time needed to retrieve data from the ROM. Without reference voltage generator 22 to bias bit line 12, after raising the voltage at the gate of transistor 18, if transistor 10 were non-operational, one would have to wait until bit line 12 was charged via transistor 18 before being able to sense the state of transistor 10. Thus, by biasing bit line 12, the propagation delay between the time transistor 18 turns on and the time the voltage at the input lead of sense amplifier 28 reliable indicates the state of transistor 10 is reduced.

In the ROM of FIG. 1, the gate of transistor 18 is connected to a Y decode line 32. Y decode line 32 and word line 16 are activated by having signals placed thereon in response to address signals received by the ROM. In this way the address signals can select an individual MOS transistor such as NMOS transistor 10 as the source of data to be transmitted on lead 30. As can be seen in FIG. 1, reference voltage lead 23 is also coupled to a plurality of other bit lines (shown as three other bit lines 38, 40 and 42) via a plurality of NMOS transistors (shown as transistors 44, 46, and 48), respectively. Boxes 50, 52, and 54 coupled to bit lines 38, 40 and 42 contain circuitry identical to that in box 56. Thus reference voltage generator 22 biases a plurality of bit lines. In some prior art ROMs, reference voltage generator 22 biases 256 bit lines. Because of this the output impedance of reference voltage generator 22 must be low enough so that if some of the bit lines are pulled low, reference voltage generator 22 can provide enough current so that the remaining bit lines will remain at reference voltage $V_{REF}$. Because of this requirement, prior art reference voltage generator 22 consumes a large amount of power even if the ROM shown is not selected, since it continues to bias the bit lines regardless of whether the ROM is selected. (As is known in the art, typical systems include a plurality of ROMs and other devices connected to a common data bus. ROMs typically include a select pin for receiving a select signal provided by a host CPU to select that ROM as a souce of data.)

SUMMARY

In accordance with this invention, an improved ROM includes a first reference voltage generator and a second reference voltage generator for biasing the bit lines in the ROM. The first reference voltage generator has a low output impedance and can provide greater current when the ROM is selected for use. The second reference voltage generator has a higher output impedance and biases the bit lines when the ROM is deselected. (When the ROM is deselected, a high output impedance reference voltage generator is sufficient to bias the bit lines, since when the ROM is deselected, none of the transistors which draw current from the bit lines will be on.) In this way, the power consumed by the ROM is minimized when it is not selected, but when it is selected, the first reference voltage generator biases the bit lines.

Due to the use of the second reference voltage generator, when the ROM goes from a deselected state to a selected state, the bit lines are already biased to the appropriate voltage by the second reference voltage generator so that the delay between the time the ROM is selected and the time the ROM produces output data on an output lead is minimized. If the bit lines were not biased while the ROM was deselected, a large time delay would be required after ROM selection while waiting for the bit lines to be charged to the appropriate value. These and other advantages of the present invention will be better understood with reference to the drawings and detailed description.

BRIEF DESCRIPTION OF THE DRAWINGS

FIG. 3 is a detailed schematic diagram of the reference voltage generators constructed in accordance with the present invention.

FIG. 4 defines the width and length dimensions of the transistors of FIG. 3.

DETAILED DESCRIPTION OF THE INVENTION

Figures 1, 2:
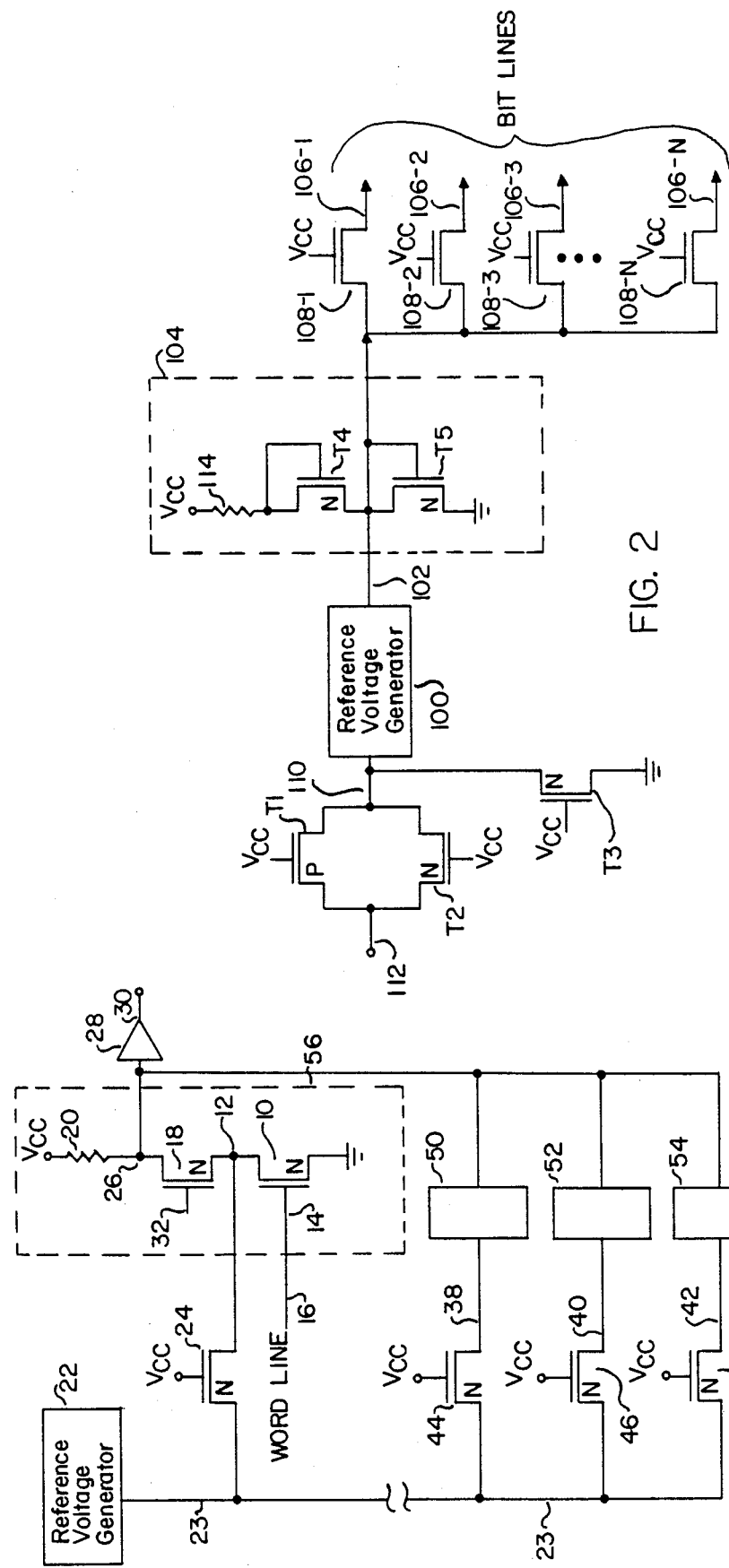
FIG. 1 is a schematic diagram of a ROM constructed in accordance with the prior art.
FIG. 2 is a block schematic diagram of a pair of reference voltage generators constructed in accordance with the present invention.

Referring to FIG. 2, a first reference voltage generator 100 constructed in accordance with the present invention provides a reference voltage on a reference voltage lead 102. In one embodiment of the invention the output impedance of reference voltage generator 100 is approximately 25 ohms and the reference voltage produced by reference voltage generator 100 is approximately 1 volt. Also illustrated in FIG. 2 is a second reference voltage generator 104 which has an output impedance of approximately 75,000 ohms. Second reference voltage generator 104 also biases lead 102 with approximately 1 volt. In a preferred embodiment of the invention lead 102 is coupled to a plurality of bit lines such as bit lines 106-1 through 106-N via a plurality of transistors 108-1 through 108-N, respectively.

Reference voltage generator 100 is connected to an enable line 110. As will be seen below, the ROM can be operated in a mode in which enable line 110 is controlled by the ROM chip select pin or in a mode in which enable line 110 is always connected to ground. When enable line 110 is held low, reference voltage generator 100 is enabled, and provides the reference voltage on lead 102. When enable line 110 is high, reference voltage generator 100 is disabled and stops driving line 102. Enable line 110 is connected to a control lead 112 via the parallel combination of a PMOS transistor T1 and an NMOS transistor T2. Control lead 112 is typically coupled to the chip select pin of the ROM. Enable line 110 is also coupled to ground via an NMOS transistor T3. The gates of transistors T1, T2 and T3 are all coupled to VCC. As described below, the state of transistors T1, T2, and T3 are programmed so that enable line 110 is either always connected to ground (transistor T3 is on and reference voltage generator 100 is enabled) or transistor T3 is always off, and transistors T1 and T2 are programmed so that enable line 110 is always driven by the signal on control lead 112.

Second reference voltage generator 104 includes a first NMOS transistor T4 having a gate and a drain coupled to VCC via a 500 KΩ resistor 114 and a source coupled to lead 102. Second reference voltage generator 104 also includes a second NMOS transistor T5 having a drain and gate coupled to lead 102 and a source coupled to ground.

Transistors T1 through T5 are all programmable during the manufacturing process. In one embodiment, transistors T1 through T5 are programmed via a boron ion implant process. When implanted with boron, NMOS transistors T2 through T5 are always off and PMOS transistor T1 is always on. If transistors T2 through T5 are not implanted with boron, transistors T2 through T5 are always on, and if transistor T1 is not implanted with boron, it is always off. This implantation process can take place concurrently with ion implantation in other parts of the ROM or in an extra implantation process. In alternative embodiments, transistors T1 through T5 are programmed in other ways, such as electrical contact masks, gate oxide masks, gate metallization masks, or other well-known means. In other embodiments, transistors T1 through T5 could be programmable after the manufacturing process by including a floating gate structure similar to that used in an EPROM or by including a polycrystalline silicon or similar fuse structure. Because of this, reference voltage generators 100 and 104 can be operated in one of three modes.

HIGH SPEED/HIGH POWER MODE

During the high speed/high power mode, transistors T1, T2, T4 and T5 are programmed to remain off and transistor T3 is programmed to always remain on. Because transistors T1 and T2 are always off, and transistor T3 is always on, enable line 110 is therefore held at ground so that reference voltage generator 100 is always enabled, thereby causing reference voltage generator 100 to constantly bias bit lines 106-1 through 106-N regardless of whether or not the ROM is selected.

As discussed below, a ROM programmed to operate in the high speed/high power mode exhibits shorter delays from the time the ROM is selected to the time output data is provided by the ROM. However, this shorter delay is achieved at the expense of greater power consumption.

In one embodiment of the invention, in the high speed/high power mode, transistors T4 and T5 are off, disabling reference voltage generator 104. This is done because, since low impedance reference voltage generation 100 is always enabled, high impedance reference voltage generator 104 is never needed to bias lead 102. By disabling reference voltage generator 104, reference voltage generator 104 consumes no power. However, it is not necessary to disable reference voltage generator 104 during the high speed/high power mode.

MEDIUM SPEED/MEDIUM POWER MODE

In a ROM constructed in accordance with the present invention and programmed to operate in a medium speed/medium power mode, transistors T1, T2, T4 and T5 are programmed to remain on and transistor T3 is programmed to remain off. Because of this, transistor T3 is always off and never pulls enable line 110 to ground. Further, transistors T1 and T2 are operative permitting the control signal on control lead 112 to be communicated to enable line 110. In this way, when an active control signal is present on control lead 112 (indicating that the ROM is currently selected) low impedance reference voltage generator 100 is enabled to bias bit lines 106-1 through 106-N. However, when the control signal on control lead 112 is inactive (high), low impedance reference voltage generator 100 is disabled and high impedance reference voltage generator 104 biases bit lines 106-1 through 106-N. In one embodiment of the invention, in the medium speed/medium power mode, approximately 200 nanoseconds is required from the time control lead 112 goes from a high state to a low state and the address lines transmit valid address data until the time data is provided on the ROM output leads (not shown). A ROM programmed to operate in the high speed mode is approximately 10% (20 nanoseconds) faster.

LOW SPEED/LOW POWER MODE

In the low speed/low power mode transistors T1 and T2 are programmed to remain on and transistors T3, T4 and T5 are programmed to remain off. Because transistors T4 and T5 are off high impedance reference voltage generator 104 is always disabled and therefore never biases bit lines 106-1 through 106-N. Similarly, transistor T3 is inoperative and never grounds enable line 110. Transistors T1 and T2 are both operative, permitting the signal on control lead 112 to be communicated to line 110. Because of this, only low impedance reference voltage generator 100 can bias bit lines 106-1 through 106-N, resulting in less power consumption because high impedance voltage generator 104 never draws any power. However, when programmed in the low power mode, the access time from the time the ROM is selected and the address data on the address lines is valid to the time data is provided on an output lead is 40–50% greater than in the medium power mode (approximately 100 nanoseconds).

The current drawn by reference voltage generators 100 and 104 in a 64K ROM constructed in accordance with the present invention, in the high speed mode is approximately 0.5 milliamps, while the current drawn by the reference voltage generators when programmed to operate in the medium power mode while the ROM is deselected is 20 microamps. In the low power mode, when the ROM is deselected reference voltage generators 100 and 104 draw a current in the picoamp range. Accordingly, the reference voltage generators constructed in accordance with the present invention are programmable to operate in one of three modes, thus permitting greater flexability in selecting the speed-power trade off desired.

The three modes are summarized in Table I below:

TABLE I

| MODE | T1 | T2 | T3 | T4 | T5 | DELAY FROM SELECT TO DATA OUT | CURRENT DRAWN BY GENERATORS 100 AND 104 |
|---|---|---|---|---|---|---|---|
| low speed/low power | on | on | off | off | off | 300 ns. | 10 pA |
| medium speed/medium power | on | on | off | on | on | 200 ns. | 20 μA |
| high speed/high power | off | off | on | off | off | 180 ns. | 0.50 mA |

In other embodiments of the invention, more than two reference voltage generators are provided with different power consumption and output impedance. These reference voltage generators are programmably selected to bias bit lines so that a ROM is provided having more programmable speed/power tradeoff options.

FIG. 3 is a detailed schematic diagram of one embodiment of reference voltage generators 100 and 104. Resistor 114 of FIG. 2 is replaced with transistor Q7 of FIG. 3 which performs the same function as resistor 114. The dimensions of the various transistors illustrated in FIG. 3, are conventionally defined in accordance with the notation depicted in FIG. 4. For example, transistor Q7 has a width of 5 microns and a length of 10 microns and is identified with the notation "5/10", whereas transistor Q1 has a width of 15 microns and a length of 10 microns, and is associated with the notation "15/10". Where only one dimension is indicated, the dimension indicated is the width and the length is 3 microns. For example transistor Q13 has a width of 6 microns and a length of 3 microns.

Referring to FIG. 3, enable line 110 is connected to NMOS transistor Q13 and a pair of CMOS inverters 200 and 202. CMOS inverters 200 and 202 provide output signals on leads 201 and 203 respectively. Lead 201 is connected to the gates of NMOS transistors Q3 and Q4 as well as the drain of transistor Q3. The source of transistor Q3 is connected to ground via an NMOS transistor Q5. The drain of transistor Q4 is coupled to VCC and the source of transistor Q4 is coupled to ground via an NMOS transistor Q6. Output lead 203 of CMOS inverter 202 is connected to the gate of NMOS transistor Q10 which is connected between the gates of transistors Q5 and Q6. Output lead 102 is connected to the source of transistor Q4, the drain of transistor Q6, and the gate of transistor Q5.

In operation, when a low signal is present on lead 110, output leads 201 and 203 are both high. Because of this, NMOS transistor Q10 is on and NMOS transistor Q13 is off. The output signal on lead 102 is therefore coupled to the gate of transistor Q6 as well as the gate of transistor Q5. If the reference voltage on reference voltage lead 102 is higher than desired, the signal at the gate of transistor Q6 will be higher than desired, causing transistor Q6 to conduct more current, which in turn decreases the voltage on lead 102. In addition, when the voltage on lead 102 is too high, transistor Q5 conducts more current which in turn decreases the voltage on lead 201, which in turn causes transistor Q4 to conduct less current from VCC to lead 102.

Conversely, if the reference voltage provided on reference voltage lead 102 is too low, the voltage at the gate of transistor Q6 is too low, thus permitting less current to flow through transistor Q6. Similarly transistor Q5 also conducts less current with a result that the voltage at the gate of transistor Q4 is increased, thus causing transistor Q4 to conduct more current from VCC to lead 102. In this way the feedback paths within reference voltage generator 100 maintain the voltage on lead 102 at a constant level of approximately 1 volt.

When the voltage present at lead 110 is high (the ROM is deselected), the output signals on leads 201 and 203 are both low, turning off transistors Q10 and Q4. Similarly transistor Q13 is turned on which brings the gate voltage of transistor Q6 to ground. Therefore, low impedance reference voltage generator 100 is disabled and no current flows from reference voltage generator 100 to lead 102. When that happens, if transistors T4 and T5 are programmed to be operative, the only source of bias voltage for lead 102 is from high impedance reference voltage generator 104.

While the invention has been taught with reference to specific embodiments, those skilled in the art will recognize that modifications can be made to the embodiments disclosed without departing from the spirit and scope of the invention. For example, the reference voltage generators of the present invention can be used in erasable programmable read only memories (EPROMs), electrically erasable programmable read only memories (EEPROMs), and fuse programmable read only memories (PROMs) as well as ROMs. The present invention can be used in conjunction with other devices as well, e.g. random access memories (RAMs) or any other integrated circuit which contains similar structures.

Also, other ratios of output impedances can be used for reference voltage generators 100 and 104, e.g. the output impedance of reference voltage generator 104 can be 100 times that of reference voltage generator 100 or more, these numbers being merely illustrative. Accordingly, all such changes come within the scope of the present invention.

I claim:

1. A semiconductor integrated control circuit comprising:
   a reference voltage line;
   a first reference voltage generator having an output selectively connected to said reference voltage line, said first reference voltage generator including an input enable line and programmable first switch means connected to said enable line, said first switch means being programmed whereby in response to a first binary voltage level on said enable line, said first reference voltage generator is activated to drive said reference voltage line with a first reference voltage;
   an external voltage means capable of selectively providing said first binary voltage level and a second binary voltage level to said enable line;
   a second reference voltage generator selectively connected to said reference voltage line and including programmable second switch means, said second reference voltage generator having an output impedance greater than that of said first reference voltage generator whereby during selective driving of said reference voltage line by said first reference voltage generator or said second reference voltage generator, or both, response time and power consumption of said control circuit are altered to meet pre-selected requirements for response time and power consumption.

2. The circuit of claim 1 wherein said first switch means comprises at least one MOS transistor and said second switch means comprises at least one MOS transistor, the conductive states of said first and second switch means being programmed by selectively doping the channels of said MOS transistors.

3. The circuit of claim 1 in which said first and second switch means are programmed to provide mid-speed, mid-power circuit requirements,
   said first reference voltage generator turning on in response to said first binary voltage level on said enable line and driving said reference voltage line, said first reference voltage generator turning off in response to said second binary voltage level on said enable line, said second binary voltage level being opposite to said first binary voltage,
   said first switch means being programmed to always connect said enable line to said external voltage means, said second reference voltage generator, including said second switch means, continuously driving said reference voltage line with a second reference voltage, said second switch means being programmed to always connect said second reference voltage generator to said reference voltage line.

4. The circuit of claim 1 in which said first reference voltage source comprises:
   a first inverter having an input lead coupled to said enable line, and having a first inverter output lead;
   a second inverter having an input lead coupled to said enable line, and having a second inverter output lead;
   first nonprogrammable switch means having a first lead and a second lead, said fist nonprogrammable switch means being conductive in response to a signal on said second inverter output lead being in a first binary state, said first nonprogrammable switch means being non-conductive in response to a signal on said second inverter output lead being in a second binary state opposite said first binary state;
   said reference voltage line being connected to said first lead of said first nonprogrammable switch means;
   a first NMOS transistor having a drain and gate coupled to said first inverter output lead, said first NMOS transistor having a source;
   a second NMOS transistor having a drain coupled to the source of said first NMOS transistor, a gate coupled to said first lead of said first nonprogrammable switch means, and a source connected to ground;
   a third NMOS transistor having a gate coupled to said first inverter output lead, a drain connected to a voltage source and a source connected to said reference voltage line; and
   a fourth NMOS transistor having a source connected to ground, a gate connected to said second lead of said first nonprogrammable switch means and a drain connected to said reference voltage line.

5. The circuit of claim 4 in which said first reference voltage generator further comprises a second nonprogrammable switch means for connecting the gate of said fourth NMOS transistor to ground in response to said enable line being in said first binary state.

6. The circuit of claim 1 wherein said first and second switch means are programmed for either a low-speed low-power control circuit requirement or a high-speed high-power control circuit requirement, and said second reference voltage generator including said second switch means comprises:
   means for providing an electrical resistance between a first lead and a second lead, said first lead being coupled to a first voltage source;
   a first MOS transistor having a gate and a drain coupled to said second lead and a source connected to said reference voltage line; and
   a second MOS transistor having a source coupled to ground and a drain and gate coupled to said source of said first MOS transistor, said first and second MOS transistors being turned off to meed said low-speed low-power control circuit requirement.

7. The circuit of claim 6 wherein said first and second MOS transistors are programmable via a process of doping the channels of said first and said second MOS transistors, said first and second MOS transistors being made nonconductive as a result of doping for a preselected range of gate voltage for said first and second MOS transistors.

8. The circuit of claim 6 wherein said first and second switch means are MOS transistors, and wherein said first and second switch means have conductive states programmable via a process of implanting dopants into the channels of said transistors.

9. The control circuit of claim 1 in which said first and second switch means are programmed to provide a high-speed high-power control circuit requirement, said second switch means being programmed to be always disabled whereby said second reference voltage generator is disconnected from said reference voltage line, and said first switch means being programmed whereby said first reference generator continuously drives said reference voltage line in response to the presence of a first binary voltage level on said enable line, said first binary voltage level being at ground potential.

10. The circuit of claim 1 in which said first and second switch means are programmed to provide a medium-speed medium-power control circuit requirement, said second switch means being programmed to be always enabled whereby said second reference voltage generator drives said reference voltage line, and said first switch means being programmed to always connect said external voltage means to said enable line, whereby in response to said first binary voltage level on said enable line, said first reference voltage generator drives said reference voltage line, and in response to said second binary voltage level, said first reference voltage generator is deactivated, said second binary voltage level being at a HIGH binary voltage level.

11. The circuit of claim 1 in which said first and second switch means are programmed to provide a low-speed low-power circuit requirement;

said second switch means being programmed to be always disabled whereby said second reference voltage generator is disconnected from said reference voltage line, and said first switch means being programmed to always connect said external voltage means to said enable line, whereby said first reference voltage generator drives said reference voltage line in response to said first binary voltage level on said enable line, and in response to said second binary voltage level, said first reference voltage generator is deactivated, said first binary voltage level being at al LOW binary voltage level.

12. The circuit of claim 9, 10 or 11 in which said first and second switch means are transistors which are programmed by selective doping during fabrication of said circuit.

13. In a circuit comprising:
a reference voltage line;
a first reference voltage generator selectively coupled to said reference voltage line for driving said line with a reference voltage;
a second reference voltage generator selectively coupled to said reference voltage line;
an enable line coupled to said first reference voltage generator, said enable line being selectively connected to ground and to an external voltage source of HIGH and LOW binary control signals through a first programmable switch means, said first reference voltage generator being inoperative when said enable line is driven by said HIGH binary control signal;

said first programmable switch means including:
a first MOS transistor connected between said enable line and ground;
a terminal for receiving said binary control signals from said external voltage source; and
MOS transistor means coupled between said terminal and said enable line, a method for programming the conductive states of said first MOS transistor and said MOS transistor means, comprising the steps of:
(i) during the fabrication of said circuit, selecting a circuit operating requirement from a group comprising high-speed high-power, mid-speed mid-power and low-speed low-power circuit requirements; and
(ii) selectively rendering one of said first MOS transistor and said MOS transistor means inoperative based upon the circuit control requirement selected in step (i).

14. The method of claim 13 wherein said step of rendering one of said first MOS transistor and said MOS transistor means inoperative includes implanting ions into the channels thereof.

15. The method of claim 13 in which said MOS transistor means includes second and third MOS transistors in parallel and in which both said second and third MOS transistors are programmed in step (ii) based on the circuit control requirement selected in step (i).

16. The method of claim 15 in which step (i) comprises selecting a high-speed high-power circuit control requirement for said circuit operations and wherein step (ii) achieves such requirement by rendering said second and third MOS transistors permanently inoperative, resulting in said enable line being connected to ground.

17. The method of claim 15 in which step (i) comprises selecting a low-power, low-speed circuit control requirement for circuit operations and wherein step (ii) achieves such requirement by rendering only said first MOS transistor permanently inoperative.

18. The method of claim 17 wherein said first reference voltage generator drives said reference voltage line with a reference voltage in response to a first binary signal on said enable line and wherein said second reference voltage generator is made permanently inoperative, said first binary signal being at a LOW binary voltage level.

19. The method of claim 16 or 17 in which said second reference voltage generator of said circuit comprises:
resistance means having a first lead for receiving a DC voltage and a second lead;
a fourth MOS transistor having a gate and a drain connected to the second lead of said resistance means, said fourth MOS transistor having a source connected to said reference voltage line;
a fifth MOS transistor having a drain and gate connected to said reference voltage line and a source connected to ground,
and wherein step (ii) aids in achieving the requirement of step (i) by rendering said fourth and fifth transistors inoperative.

20. The method of claim 19 wherein said step (ii) of rendering said fourth and fifth transistors inoperative is further characterized by subjecting the channels of said fourth and fifth MOS transistors to an ion implant process.

* * * * *